United States Patent
Magers

(10) Patent No.: US 9,621,387 B1
(45) Date of Patent: Apr. 11, 2017

(54) I/Q MODULATOR AND DEMODULATOR WITH WIDE INSTANTANEOUS BANDWIDTH AND HIGH LOCAL-OSCILLATOR-PORT-TO-RADIO-FREQUENCY-PORT ISOLATION

(71) Applicant: NATIONAL INSTRUMENTS CORPORATION, Austin, TX (US)

(72) Inventor: Justin R. Magers, Santa Rosa, CA (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 0 days.

(21) Appl. No.: 14/879,285

(22) Filed: Oct. 9, 2015

(51) Int. Cl.
| | |
|---|---|
| H04B 1/38 | (2015.01) |
| H04L 27/20 | (2006.01) |
| H04L 27/227 | (2006.01) |
| H04B 1/403 | (2015.01) |
| H04B 1/48 | (2006.01) |

(52) U.S. Cl.
CPC ........... *H04L 27/206* (2013.01); *H04B 1/403* (2013.01); *H04B 1/48* (2013.01); *H04L 27/2273* (2013.01)

(58) Field of Classification Search
CPC ......... H03D 7/1458; H03D 2200/0023; H03D 7/14; H03D 7/165; H03F 2200/06; H03F 2200/09; H04L 25/0272; H03H 7/42
See application file for complete search history.

(56) References Cited

U.S. PATENT DOCUMENTS

| | | | | |
|---|---|---|---|---|
| 3,432,775 | A | 3/1969 | Hamel | |
| 6,016,422 | A * | 1/2000 | Bartusiak | H03C 3/40 455/324 |
| 8,362,835 | B2 * | 1/2013 | Meharry | H03F 3/602 330/165 |
| 8,803,586 | B1 * | 8/2014 | Lee | H03D 7/1441 327/355 |
| 2003/0130006 | A1 * | 7/2003 | Reynolds | H03D 7/1433 455/550.1 |

(Continued)

OTHER PUBLICATIONS

Nahapetyan, V. et al.—"DC Offset Suppression in Double Balance Direct Conversion Receivers"—IEEE Ninth International Conference on HF Radio Syystems and Techiques (Conference Publication No. 493)—Jun. 2003 (3 pages).

(Continued)

*Primary Examiner* — Khanh C Tran
(74) *Attorney, Agent, or Firm* — Meyertons Hood Kivlin Kowert & Goetzel, P.C.; Jeffrey C. Hood

(57) ABSTRACT

An improved quadrature modulator/demodulator (IQMD) may use two-phase quadrature local oscillator (LO) signal generation for generating 0° and 90° LO signals, and an anti-phase combiner/divider (at 0° and 180°) on the RF (radio frequency) port. The IQMD may include mixers (which may be double-balanced passive mixers) that function as downconverters when a signal is incident at their radio frequency (RF) ports, and function as upconverters when signals are incident on their intermediate frequency (IF) ports. Accordingly, the IQMD may function as an I/Q modulator by connecting digital-to-analog converters (DAC) to the differential I and Q ports, and/or it may also function as an I/Q demodulator by connecting analog-to-digital converters (ADC) to the differential I and Q ports.

20 Claims, 4 Drawing Sheets

Note: $\bar{I} = \sim I$ and $\bar{Q} = \sim Q$

(56) References Cited

U.S. PATENT DOCUMENTS

| | | | | |
|---|---|---|---|---|
| 2004/0057534 A1* | 3/2004 | Masenten | ............ | H03M 3/334 |
| | | | | 375/316 |
| 2005/0101267 A1* | 5/2005 | Smithson | ................ | H03C 3/40 |
| | | | | 455/108 |
| 2009/0081985 A1* | 3/2009 | Rofougaran | ............ | H03D 9/02 |
| | | | | 455/326 |
| 2014/0091849 A1 | 4/2014 | Zienkewicz et al. | | |

OTHER PUBLICATIONS

Gavell, Marcus et al.—"A Linear 70-95 GHz Differential IQ Modulator for E-band Wireless Communicatio"—IEEE MTT-S International Microwave Symposium Digest (MTT)—May 23-28, 2010; pp. 788-791 (4 pages).

Li, Frank Xiaohui and Corsetto, Greg—"Multi-Order Cancellation Technology"—Microwave Journal, Oct. 1997, pp. 84, 86-91 (7 pages).

\* cited by examiner

Note: $\bar{I} = {\sim}I$ and $\bar{Q} = {\sim}Q$

*Balun used for First Circuit*

*Demodulator Configuration of the Baseband Ports*

I/Q MODULATOR AND DEMODULATOR WITH WIDE INSTANTANEOUS BANDWIDTH AND HIGH LOCAL-OSCILLATOR-PORT-TO-RADIO-FREQUENCY-PORT ISOLATION

FIELD OF THE INVENTION

The present invention relates to the fields of wireless communication and instrumentation, and more particularly to the design of an I/Q modulator and demodulator.

DESCRIPTION OF THE RELATED ART

Wireless communication systems are rapidly growing in usage. In recent years, wireless devices such as smart phones and tablet computers have become increasingly sophisticated. In addition to supporting telephone calls, many mobile devices now provide access to the internet, email, text messaging, and navigation using the global positioning system (GPS), and are capable of operating sophisticated applications that utilize these functionalities.

Digital wireless communications are typically implemented through the use of modulators and demodulators, which provide a necessary RF (radio frequency) interface for systems such as cordless phones, wireless networks, and wireless peripheral devices for computers, in addition to test and control systems that may use a wireless interface to couple certain system elements. One commonly used modulation method that lends itself well to digital processes is "quadrature modulation", which employs two carriers out of phase by 90° and modulated by separate signals. This modulation technique is also referred to as "I/Q Modulation", where "I" refers to the "in-phase" component of the waveform, and "Q" refers to the quadrature component, or 90°-out-of-phase component of the waveform. In its various forms, I/Q modulation provides an efficient way to transfer information, and also works well with digital formats. An I/Q modulator may be used for amplitude modulation (AM), frequency modulation (FM) and phase modulation (PM). There are also many digital encoding standards that allow for the transmission of vast amounts of data over wireless RF interfaces in shorter periods of time.

The development of next generation wireless systems calls for increased data transfer capabilities. One example of a next generation standard is 5G (5th generation mobile networks or 5th generation wireless systems) which represents the next major phase of mobile telecommunications standards beyond the current 4G/IMT-Advanced standards. One essential goal for 5G systems is to deliver increased capacity for cellular access, with a rough goal of approximately 10 Gbps (10 gigabits per second) peak data rates and 100 Mbps (100 megabits per second) at cell edges. Possible schemes of achieving increased capacity include high rank MIMO (multiple input multiple output) and beamforming techniques, higher order modulation schemes, and increased instantaneous bandwidth (IBW), or some combination of each. Increased IBW is also beneficial for other systems in which wireless data transmission may be a less costly solution than installation of fiber optic systems. Such systems include cellular front-haul (the connection from remote radio heads to base station controllers), cellular backhaul (the connection from the mobile network to the wired network), and point-to point radio links. Large IBW also enables high capacity short range radio links in the 60 GHz range due to atmospheric oxygen absorption. The applications for these links are wireless LAN (local area network; e.g. IEEE 802.1 lad) and wireless transmission of high-definition video, as well as cellular backhaul, cellular access, Wi-Fi offloading, connector free platform extension (wireless docking), device-to-device collaboration, multi-media kiosks, and wireless PCIe extension.

I/Q modulators and demodulators are key components of modern digital radio systems because they offer potentially higher levels of integration due to decreased reliance on high-Q filters as required by super-heterodyne systems. Additionally, I/Q modulation and demodulation is advantageous for systems with high IBW because twice the IBW can be achieved for the same sample rate as compared with super-heterodyne systems that employ intermediate frequency (IF) sampling. Unfortunately, most I/Q modulators and demodulators come with their own set of impairments such as DC offsets, I/Q mismatch, even-order distortion, flicker noise, and LO (local oscillator) leakage (from the LO port to the RF port) that can reduce the dynamic range of digital radio systems that employ them. LO leakage reflecting back into modulator/demodulator result in DC offsets via self-mixing. These static DC offsets can be corrected using DSP (digital signal processing) techniques at the expense of decreased dynamic range.

In systems using orthogonal frequency division multiplexing (OFDM), the sub-carriers near DC are often left unused such that it is more tolerant of DC offsets. Unlike OFDM single carrier modulation is susceptible to DC offsets. However, single-carrier modulation is preferred in high frequency wide IBW systems over OFDM due to lower peak-to-average power ratio which decreases the linearity requirement on power amplifiers leading to reduced power consumption and higher efficiency. Power amplifier linearity and efficiency are especially important at millimeter wave frequencies where the available spectrum exists to support communications links with large IBW, but low cost CMOS power amplifiers have difficulty providing the required transmit power. In addition to static DC offsets, LO leakage that radiates off the receiver antenna and reflects off an external obstruction which is moving relative to the receiver can cause time-varying DC offsets. Finally, LO leakage can be amplified by the transmitter's power amplifier and make it difficult for receiver to demodulate. Thus, radio standards such as 802.1 lad specify that the power at the carrier frequency must be significantly less than total signal power.

Most present day solutions employ multiple mixers and LO distribution networks with proper phase relationships in order to decrease LO leakage and the DC offsets resulting from self-mixing. In some systems, four mixers are employed and are connected using four-phase quadrature LO generation (0°, 90°, 180°, and 270°) and an in-phase RF divider/combiner. Some of these systems feature a single node that ties the RF ports of the four mixers together, which is suitable for integrated circuits. Some systems use a suitable in-phase combining network which is more appropriate for printed circuit boards where longer lengths between mixers are required. In both cases, LO signals which leak to the RF ports of the mixers due to the non-infinite LO-to-RF isolation are summed at the RF port of the modulator or demodulator. Specifically, the 0° and 180° LO leakage signals cancel each other, and the 90° and 270° LO leakage signals cancel each other.

Other corresponding issues related to the prior art will become apparent to one skilled in the art after comparing such prior art with the present invention as described herein.

SUMMARY OF THE INVENTION

Various embodiments of an improved I/Q modulator/demodulator (IQMD) feature a modulator and demodulator topology which utilizes a two-phase quadrature LO (local oscillator) signal generation process for providing 0° LO signals and 90° LO signals, and further feature an anti-phase combiner/divider (0° and 180°) on the RF (radio frequency) port. The IQMD may include mixers (in some embodiments, double-balanced passive mixers) that function as downconverters when a signal is incident on their RF ports or they may function as upconverters when signals are incident on their IF (intermediate frequency) ports. Thus, the IQMD may equally function as an I/Q modulator, when digital-to-analog converters (DAC) are connected to the differential I and Q ports, and as an I/Q demodulator when analog-to-digital converters (ADC) are coupled to the differential I and Q ports.

The IF port of the mixer (hereinafter also simply referenced as "mixer") may be most often DC-coupled. Therefore, embodiments of the IQMD may accommodate modulated signals with baseband frequency content at 0 Hz. Another feature of the mixer may be a wide bandwidth on its IF port, thus allowing the IQMD to handle signals with very wide instantaneous bandwidth. As opposed to single-ended I/Q modulators and demodulators, the differential baseband ports are convenient for connecting to DACs and ADCs, as they usually have differential analog outputs and inputs, respectively. The use of differential signaling provides substantial benefits such as cancellation of even-order intermodulation distortion, immunity to far-field radiation, and common-mode rejection of interfering signals. The LO and RF ports of the IQMD topology may remain single-ended, making it convenient to interface with typical high-frequency circuits.

In addition to the mixers, various embodiments of an IQMD circuit may include several other functional blocks. In one set of embodiments, the IQMD may include a first circuit (which may be a 180° hybrid circuit 4-port circuit) that, when excited by an RF signal at a first port (also referred to as a "delta" port), may generate signals at a third port (also referred to as a "+" port) and a fourth port (also referred to as a "−" port). The generated signals may be power attenuated by a specified amount (e.g. 3 dB), and may be out of phase (e.g. by 180°) with respect to each other. If the first circuit is instead excited by a signal at a second port (also referred to as a "sum" port), the generated signals at the third ("+") port and fourth ("−") port may each be attenuated by a specified amount (e.g. 3 dB), and may be in phase, or 0° degrees out of phase. If the first circuit is excited at the third ("+") and fourth ("−") ports with two signals that have the same phase and equal magnitude, then the signals may appear at the second ("sum") port because they are added, and no signal may appear at the first ("delta") port because they are subtracted. Likewise, if the first circuit is excited at the third ("+") and fourth ("−") ports with two signals that are 180° out of phase and have the same magnitude, then the signal may be added at the first ("delta") port and no signal may appear at the second ("sum") port.

At the LO port input, the IQMD may include a 0° power divider. When excited at the LO port, the power divider may output two signals which are each attenuated by a specified amount (e.g. 3 dB) and have the same phase. It should be noted that the power divider circuit may also function as a power combiner for signals that are in-phase and are of equal magnitude. A respective second circuit, which may be a 90° hybrid circuit, may be connected to the oscillator port of each mixer. The second circuit may be a 3-port circuit which, when excited by a signal at its input port, may generate two respective output signals that are 90° out-of-phase. In some embodiments, the second circuit may be a 4-port hybrid circuit that also includes an isolation port terminated in a resistive load.

The IQMD circuit may operate as either a modulator or demodulator. When combined with analog-to-digital converters (ADCs) on the respective differential "I" and "Q" ports (i.e. on the differential pair of I ports and the differential pair of Q ports), the IQMD may function and operate as an I/Q demodulator. In this mode of operation, a signal may be provided to the RF port and may be split into two signals of opposite polarity on the third and fourth ports of the first circuit. The split signals may be further split, in phase, and each phase-split signal may be provided into the input of a respective corresponding one of the mixers. The LO signal may be provided to an in-phase power divider and the power-divided LO signals may be provided to respective second circuits that drive each mixer with two sets of signals that are separated by 0 or 90 degrees. When the RF and LO signals combine in the mixers, the respective baseband signals at the I port and ~I (i.e. "not I") port have the same magnitude while being 180° out of phase with respect to each other, that is, the amplitude of the signal at the I port is commensurate with the amplitude of the signal at the ~I port, while there is a 180° phase difference between the signal at the I port and the signal at the ~I port. The respective baseband signals at the Q port and ~Q (i.e. "not Q") port also have the same magnitude and are 180° out of phase with respect to each other, that is, the amplitude of the signal at the Q port is commensurate with the amplitude of the signal at the ~Q port, while there is a 180° phase difference between the signal at the Q port and the signal at the ~Q port. Furthermore, there may be a phase difference of 90° between I and Q (and ~I and ~Q), respectively. With these relative phase shifts and appropriate digital signal processing, digitally modulated signals may be demodulated.

When the IQMD circuit is operated as an I/Q modulator, the incident baseband signals may be provided on the differential "I" and "Q" ports and the RF port may be used as the output port. The operation of the circuit is similar as described above with respect to operating the IQMD as a demodulator, except that the signal is flowing in the opposite direction. It should be noted that the mixers may not have infinite isolation between their respective LO ports and RF ports, which may result in the LO signal leaking into the RF path. In the case of an I/Q modulator, the LO signal may fall at the center of the instantaneous RF bandwidth. If the LO signal is too large, it may prevent the corresponding I/Q demodulator at the other end of the wireless link from demodulating the signal. In various embodiments of the IQMD circuit, the respective LO signals that leak from the respective LO ports of the mixers associated with the pair of differential in-phase ports to the third and fourth ports of the first circuit, respectively, both have the same relative phase. Thus, as these two signals enter the first circuit, they are dissipated into the load connected at the second port (or "sum" port) of the first circuit instead of emanating out of the first port (or "delta" port). The same is true for signals which leak from the respective LO ports of the mixers (associated with the pair of differential quadrature ports) to the third and fourth ports of the first circuit, respectively. Hence, the LO-to-RF isolation of the I/Q modulator may approximately equal to, or be within a specified percentage of the sum (in dB) of the LO-RF isolation of each mixer and the isolation of the first circuit.

Other aspects of the present invention will become apparent with reference to the drawings and detailed description of the drawings that follow.

BRIEF DESCRIPTION OF THE DRAWINGS

A better understanding of the present invention can be obtained when the following detailed description of the preferred embodiment is considered in conjunction with the following drawings, in which.

Figure 1:
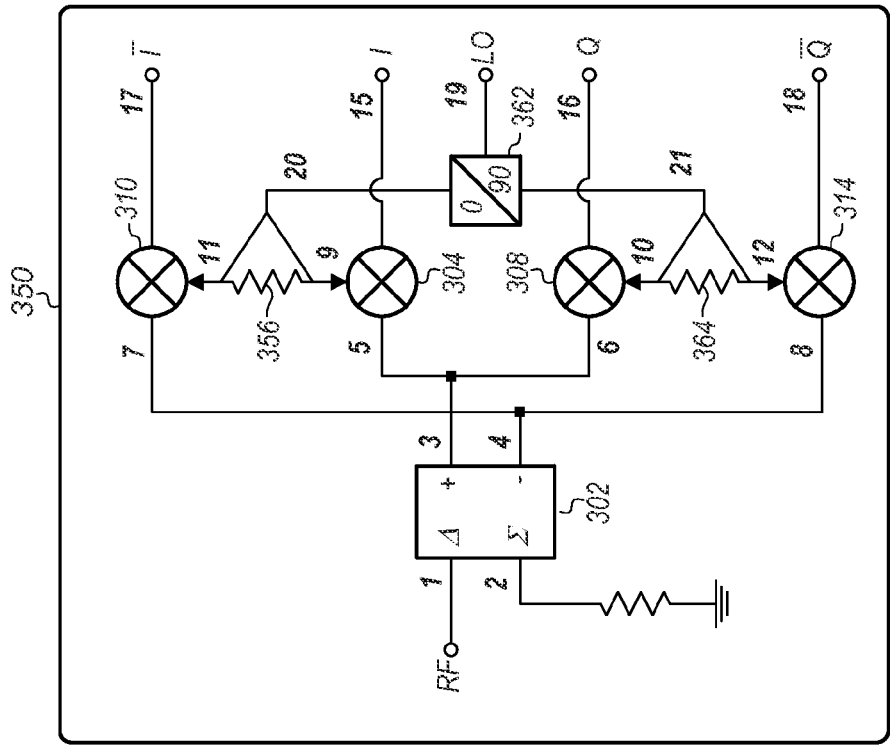
FIG. 1 shows a circuit diagram of first exemplary I/Q modulator/demodulator, according to some embodiments.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

Embodiments of an I/Q modulator/demodulator (IQMD) circuit described herein may be used in a variety of systems and devices that use I/Q modulation/demodulation. Such devices and systems include systems designed to perform test and/or measurement functions, to control and/or model instrumentation or industrial automation hardware, or to model and simulate functions, e.g., modeling or simulating a device or product being developed or tested, etc. Embodiments of the IQMD circuit may also be included in various radio frequency (RF) devices such as wireless communication devices (e.g. cellular phones, tablets, wearable devices such as smart watch and smart glasses, etc.). More specifically, embodiments of the disclosed IQMD may be used in various instances where modulation/demodulation, more specifically I/Q modulation/demodulation of signals is performed. However, it is noted that various embodiments may be used for a variety of applications, and such applications are not intended to be limited to those enumerated above. In other words, applications discussed in the present description are exemplary only, and various embodiments of I/Q modulator/demodulator circuits with differential baseband may be used in any of various types of systems.

FIG. 1 shows a circuit diagram of an exemplary I/Q modulator/demodulator (IQMD) 300 according to some embodiments. IQMD 300 may feature a modulator and demodulator topology that utilizes two-phase quadrature LO generation, using a local oscillator (LO) input (19) and circuits 306 and 312 for generating 0° and 90° phase LO signals. The IQMD 300 may further include an anti-phase combiner/divider circuit 302 for combining out-of-phase signals present on ports 3 and 4 onto port 1, and terminating in-phase signals at port 3 and 4 onto the load connected to port 2. The IQMD 300 may also include mixers 304, 308, 310 and 314 that may function as downconverters when a signal is provided at their respective RF ports (5-8), and may also function as upconverters when signals are provided at their IF (intermediate frequency) ports (15-18). The IQMD may thereby function as an I/Q modulator by coupling digital-to-analog converters (DAC) to the differential I and Q ports (15-18), or it may function as an I/Q demodulator by coupling analog-to-digital converters (ADC) to the differential I and Q ports (15-18). The differential I ports (15, 17) are also referred to herein as differential in-phase ports, and differential Q ports (16, 18) are also referred to herein as differential quadrature ports.

The respective IF ports (15-18) of mixers 304, 308, 310 and 314 may be DC-coupled or they may be AC coupled, and various embodiments of the IQMD 300 may accommodate modulation formats with no information centered at 0 Hz. Furthermore, the respective IF ports (15-18) of mixers 304, 308, 310 and 314 may be wide bandwidth ports, allowing the IQMD 300 to handle signals with very wide instantaneous bandwidth. In contrast to single-ended I/Q modulators and demodulators, differential baseband ports may be used to connect to DACs and ADCs, as DACs usually have differential analog outputs and ADCs usually have differential analog inputs. The use of differential signaling may facilitate cancellation of even-order intermodulation distortion, immunity to far-field radiation, and common-mode rejection of interfering signals. The LO port (19) and RF port (1) of IQMD 300 may remain single-ended, allowing IQMD 300 to conveniently interface with high-frequency circuits that are most often single-ended.

In addition to the mixers 304, 308, 310 and 314, embodiments of IQMD circuit 300 may include several other functional blocks as shown in FIG. 1. For example, IQMD 300 may include a first circuit 302 (in some embodiments, a 180 degree or 180° hybrid circuit), which may feature four ports. When excited by an RF signal at a first port (also referred to as a "delta" port, and indicated by the numeral '1'), first circuit may output signals at a third port (also referred to as a "+" port, and indicated by the numeral '3') and a fourth port (also referred to as a "−" port, and indicated by numeral '4'). The output signals at ports 3 and 4 may be power attenuated by a specified amount (e.g. 3 dB), and may be out of phase with respect to each other, e.g. by 180°. If the first circuit 302 is instead excited by a signal at a second port (also referred to as a "sum" port, and indicated by numeral '2'), the output signals at the third ("+") port and fourth ("−") port may each be attenuated by a specified amount (e.g. 3 dB), and may be in phase, or 0° degrees out of phase. It should be noted, however, that as shown in FIG. 1 (and also FIG. 2), the port 2 is terminated, and is therefore not configured to be functionally excited by a signal as opposed to port 1. If the first circuit is excited at the "+" (3) and "−" (4) ports with two signals of the same phase and of equal magnitude, then the sum of those two signals may therefore appear at the "sum" (2) port, and no signal may appear at the "delta" (1) port, resulting from the difference of the two signals trending to zero. Similarly, if the first circuit 302 is excited at the "+" (3) port and the "−" (4) port with two signals, respectively, that are 180° out of phase with respect to each other and have the same magnitude, then the two signals may be added at the "delta" (1) port and no signal may appear at the "sum" (2) port.

The IQMD 300 may also include a 0° power divider 316 at the LO port input (19). When excited at the LO port (19), the power divider may output two signals at ports 13 and 14.

The signals output by power divider 316 may each be attenuated by a specified amount (e.g. 3 dB) and may both have (or they both may be of) the same phase. It should be noted that the power divider circuit 316 may also function as a power combiner for signals that are in-phase and are of equal magnitude, though circuit 316, as shown in the figures is not used in that manner. Respective second circuits 306 and 312 (in some embodiments, 90° hybrid circuits also having an isolation port—not shown—terminated in a resistive load) may be connected to corresponding oscillator ports of each mixer circuit 304, 308, 310 and 314 as shown. Each second circuit (306 and 312) may have three ports. It should be noted, however, that the second circuits (306 and 312) may be 90° hybrid circuits that may have a fourth port, specifically an isolation port, which may be terminated with a resistive load for the purposes of operation disclosed herein. When excited by a signal at its respective input port (input port 13 for second circuit 306, and input port 14 for second circuit 312), each second circuit (306 and 312) may generate two respective output signals (output signals 9 and 10 for second circuit 306, and 112 and output signals 12 for second circuit 312) that are 90° out-of-phase with respect to each other. The IQMD circuit 300 may operate as either a modulator or demodulator.

Operation of Various Embodiments of IQMD Circuits

Referring to at least FIGS. 1 and 2, the operation of various embodiments of an IQMD circuit may be described as follows. A modulator/demodulator (e.g. IQMD 300 or 350) may include an RF port (e.g. RF port), and may further include a first circuit (e.g. circuit 302) having a first port (e.g. port 1) coupled to the RF port, and further having a second port (e.g. port 3) and a third port (e.g. port 4). The first circuit may generate a pair of out-of-phase input signals at the second port and third port, responsive to the first port being excited by a first signal received at the RF port, and may further generate a summed output signal at the first port, responsive to the second port and the third port being excited by a pair of out-of-phase output signals. The modulator/demodulator may also include a first mixer (e.g. a mixer that includes mixer circuits 304 and 306) coupled to the second port. The first mixer may downconvert a first out-of-phase input signal of the pair of out-of-phase input signals to a first pair of incoming baseband signals (e.g. baseband signals received at ports 15 and 16), and upconvert a first pair of outgoing baseband signals (e.g. baseband signals provided at ports 15 and 16) to a first out-of-phase output signal of the pair of out-of-phase output signals. The modulator/demodulator may further include a second mixer (e.g. a mixer that includes mixer circuits 310 and 314) coupled to the third port. The second mixer may downconvert a second out-of-phase input signal of the pair of out-of-phase input signals to a second pair of incoming baseband signals (e.g. baseband signals received at ports 17 and 18), and upconvert a second pair of outgoing baseband signals (e.g. baseband signals provided at ports 17 and 18) to a second out-of-phase output signal of the pair of out-of-phase output signals.

The modulator/demodulator may also include a local oscillator (LO) port (e.g. port 19) to receive an LO signal, and the first mixer and the second mixer may perform upconversion and/or downconversion based on the LO signal. The modulator/demodulator may also include a zero-phase power splitter (e.g. power splitter 316) coupled to the LO port to receive the LO signal and derive a first LO signal (e.g. LO signal provided at port 13) and a second LO signal (e.g. LO signal provided at port 14) from the LO signal, where the first LO signal and the second LO signal are in phase with respect to each other. The first mixer may perform upconversion and/or downconversion based on the first LO signal, and the second mixer may perform upconversion and/or downconversion based on the second LO signal. In some embodiments, the modulator/demodulator may include a phase shifter (e.g. phase shifter 362) coupled to the LO port to receive the LO signal and generate an in-phase LO signal (e.g. the LO signal provided at port 20) and a quadrature LO signal (e.g. the LO provided at port 21) based on the LO signal. The first mixer and the second mixer may each perform upconversion and/or downconversion based on the in-phase LO signal and the quadrature LO signal.

In further embodiments, the modulator/demodulator may also include a first zero-phase power splitter (e.g. power splitter 356) and a second zero-phase power splitter (e.g. power splitter 364). The first zero-phase power splitter may receive the in-phase LO signal and may derive a first in-phase LO signal and a second in-phase LO signal from the in-phase LO signal. The second zero-phase power splitter may receive the quadrature LO signal and derive a first quadrature LO signal and a second quadrature LO signal from the quadrature LO signal. The first mixer may then perform upconversion and downconversion using the first in-phase LO signal and the first quadrature LO signal, and the second mixer may perform upconversion and downconversion using the second in-phase LO signal and the second quadrature LO signal.

In some embodiments, the first circuit may be a hybrid circuit that further includes a fourth port (e.g. port 2), and may generate a second summed output signal at the first port, responsive to the second port and the third port being excited by a pair of in-phase output signals. It should be noted that in the various embodiments explicitly disclosed herein, port 2 is shown as being terminated with a resistor to ground. In some embodiments the first circuit may be a balun circuit (e.g. balun circuit 402), with the first port of the first circuit being an unbalanced port of the balun circuit, and the second and third ports of the first circuit being balanced ports of the balun circuit.

In some embodiments, the first pair of incoming baseband signals may include a first incoming in-phase baseband signal and a first incoming quadrature baseband signal, and the first pair of outgoing baseband signals may include a first outgoing in-phase baseband signal and a first outgoing quadrature baseband signal. Furthermore, the second pair of incoming baseband signals may include a second incoming in-phase baseband signal and a second incoming quadrature baseband signal, and the second pair of outgoing baseband signals may include a second outgoing in-phase baseband signal and a second outgoing quadrature baseband signal. The first incoming in-phase baseband signal and the second incoming in-phase baseband signal may form an incoming pair of differential in-phase baseband signals (e.g. signals I and ~I), and the first incoming quadrature baseband signal and the second incoming quadrature baseband signal may form an incoming pair of differential quadrature baseband signals (e.g. Q and ~Q). In addition, the first outgoing in-phase baseband signal and the second outgoing in-phase baseband signal may form an outgoing pair of differential in-phase baseband signals (e.g. I and ~I), and the first outgoing quadrature baseband signal and the second outgoing quadrature baseband signal may form an outgoing pair of differential quadrature baseband signals (e.g. Q and ~Q).

In some embodiments, each mixer may include a first mixer circuit (e.g. mixer circuit 304 or mixer circuit 310) which may receive an in-phase baseband signal when upconverting, and provide an in-phase baseband signal when downconverting, and may also include a second mixer circuit (e.g. mixer circuit 308 or mixer circuit 314) which may receive a quadrature baseband signal when upconverting, and provide a quadrature baseband signal when downconverting. In some embodiments, the first mixer circuit and the second mixer circuit may each be double-balanced passive mixer circuits. Furthermore, in one set of embodiments, each mixer may include a phase shifter circuit (e.g. phase shifter circuit 306 or phase shifter circuit 312) which may generate an in-phase oscillator signal and a quadrature oscillator signal based on a received local oscillator signal, provide the in-phase oscillator signal to the first mixer circuit and provide the quadrature oscillator signal to the second mixer circuit. The first mixer circuit may then perform modulation and demodulation using the in-phase oscillator signal, while the second mixer circuit may perform modulation and demodulation using the in-phase oscillator signal.

Demodulator Operation

Figure 4:
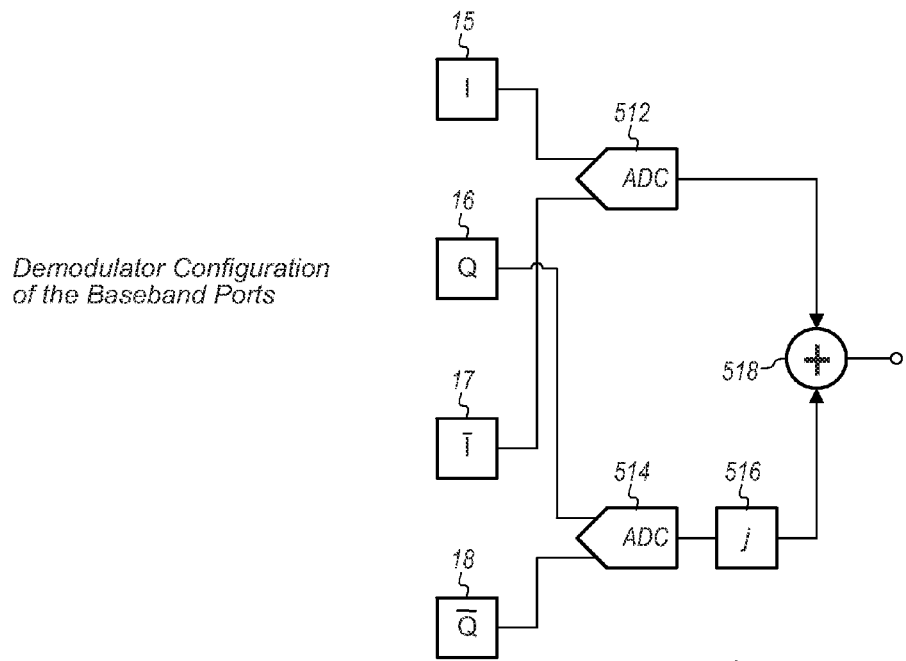
FIG. 4 shows a partial circuit diagram of an exemplary demodulator configuration of the baseband ports for an I/Q modulator/demodulator, according to some embodiments.

Referring again to FIG. 1 (and/or FIG. 2), when combined with analog-to-digital converters (ADCs) on the respective pair of differential "I" ports (15, 17) and respective pair of differential "Q" ports (16, 18), IQMD 300 may function and operate as an I/Q demodulator. FIG. 4 shows a partial circuit diagram of an exemplary demodulator configuration of the baseband ports (I, ~I, Q, and ~Q) for IQMD 300, according to some embodiments. As seen in FIG. 4, ADC 512 is coupled to the pair of differential in-phase ports (15, 17), while ADC 514 is coupled to the pair of differential quadrature ports (16, 18) to provide a demodulated digital baseband signal at the output of summing circuit 518.

Referring again to FIG. 1, a signal may be provided to the RF port (1) and may be split into two signals of opposite polarity on nodes 3 and 4. The split signals may be further split, in phase, and each phase-split signal (at ports 3 and 4, respectively) may be provided into the input of a respective corresponding one of the mixers 304, 306, 310, 314. The LO signal (at node 19) may be provided to the in-phase power divider 316, and the power-divided LO signals may drive each mixer (304, 306, 310, 314) with two sets of signals that are separated by 0° or 90°. When the RF and LO signals combine in the mixers 304, 306, 310, 314, the respective baseband signals at the pair of differential in-phase ports (15, 17) have the same magnitude and are 180° out of phase with respect to each other, that is, the amplitude of the signal at the I port (15) is commensurate with the amplitude of the signal at the ~I port (17), while there is a 180° phase difference between the two signals. The respective baseband signals at the pair of differential quadrature ports (16, 18) also have the same magnitude and are 180° out of phase with respect to each other, that is, the amplitude of the signal at the Q port is commensurate with the amplitude of the signal at the ~Q port, while there is a 180° phase difference between the two signals. Furthermore, there is a phase difference of 90° between I and Q (and ~I and ~Q), respectively.

Modulator Operation

When the IQMD 300 circuit is operated as an I/Q modulator, the incident baseband signals may be provided on the pair of differential "I" ports (15, 17) and on the pair of differential "Q" ports (16, 18). In this case the RF port (1) may be used as the output port. The operation of the circuit is similar to the demodulator operation described above, with the difference that the signal is flowing in the opposite direction, that is, from the two pairs of differential signal ports (15-18) to the RF port (1). It should be noted that mixers 304, 306, 312, 314 may lack infinite isolation between their respective LO ports (9-12) and RF ports (5-8), which may result in the LO signal leaking into the RF path. In the case of an I/Q modulator, the LO signal may fall at the center of the instantaneous RF bandwidth. If the LO signal is too large, it may prevent a corresponding I/Q demodulator at the other end of the wireless link from demodulating the signal.

It is worth noting that when used as an I/Q modulator, embodiments of IQMD circuit 300 (and 350) may operate to also reject common-mode signals that are present on the baseband differential pairs (I/~I and Q/~Q). For example, if a common-mode signal is present on the differential pair Q/~Q and that common-mode signal is upconverted, then it may appear at the RF ports of each I/Q mixer with the same amplitude and phase and may thus be combined and dissipated in the 50Ω termination on the sum port (i.e. the resistor coupled at port 2) of the first circuit 302.

Additional Considerations

It should further be noted that in various embodiments of IQMD circuit 300, the respective LO signal that may leak from node 9 (via RF port 5) at mixer 304 to node 3 of circuit 302, and the respective LO signal that may leak from node 11 (via RF port 7) at mixer 310 to node 4 of circuit 310, both have the same relative phase. Thus, as these two signals appear at the first circuit (at ports 3 and 4), they may be dissipated into the load connected at terminal (or node) 2 of the first circuit 302 instead of emanating out of RF port 1. The same is true for the respective LO signal that may leak from node 10 at mixer 308 (via RF port 6) to node 3 of circuit 302, and the respective LO signal that may leak from node 12 (via RF port 8) at mixer 314 to node 4 of circuit 302. Hence, the LO-to-RF isolation of the IQMD circuit 300 may approximately equal to, or be within a specified percentage of the sum (in dB) of the LO-to-RF isolation of each mixer 304, 306, 312, 314 and the isolation of the first circuit 302.

Alternate Embodiments

Figure 2:
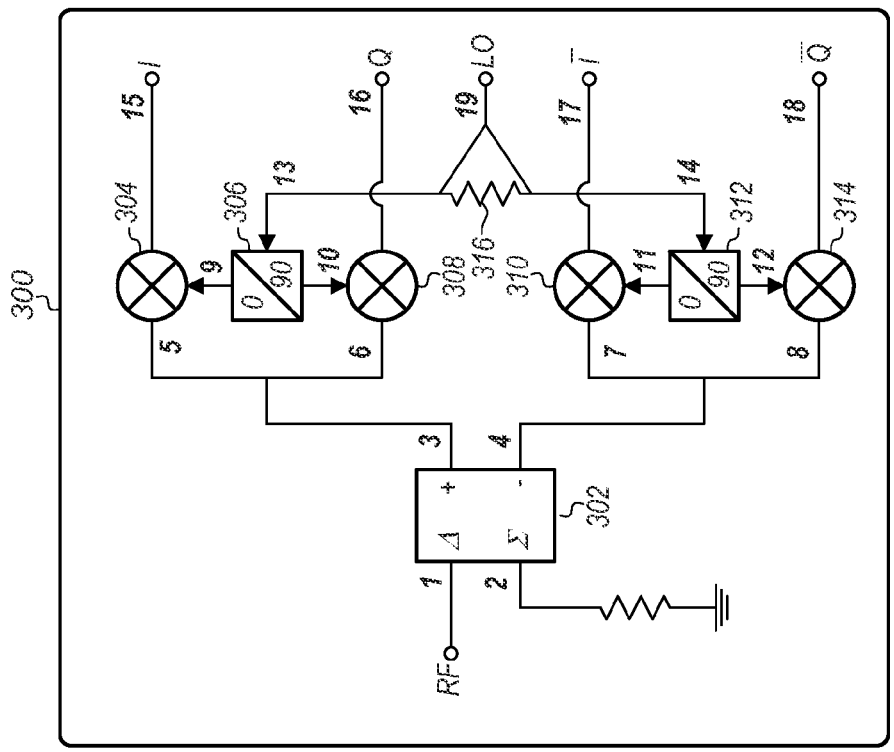
FIG. 2 shows a circuit diagram of a second exemplary I/Q modulator/demodulator, according to some embodiments.

FIG. 2 shows a circuit diagram of an alternate implementation 350 of an I/Q modulator/demodulator, according to some embodiments. The port numbers in FIG. 2 correspond to the port numbers in FIG. 1 for each port number that is included in both figures. As shown in FIG. 2, as opposed to including two phase shifter circuits (such as circuits 306 and 312 in FIG. 1), circuit 350 includes a single phase shifter circuit 362, with its input connected to LO port 19 to receive the local oscillator signal. The circuit 362 may be excited by the LO signal, and responsive to the LO signal, generate two respective output signals that are 90° out-of-phase with respect to each other. In other words, phase shifter circuit 362 may generate an in-phase LO signal at port 20, and a quadrature LO signal at port 21. Thus, the in-phase oscillator signal may be provided to a first 0° power divider 356 at port 20, and the quadrature oscillator signal may be provided to a second 0° power divider 364 at port 21. When excited at their respective input ports (20, 21), the power dividers may output respective pairs of signals at ports 9 and 11, and 10 and 12. Each respective pair of signals output by the power dividers (356 and 364) includes two respective signals that may be attenuated by a specified amount (e.g. 3 dB) and may be in phase with respect to each other. For example, the pair of signals output by power divider 356 at ports 9 and 11 may be in phase with respect to each other, and/or they may each be attenuated by a specified amount. The same holds for power divider 364.

In this manner, rather than splitting the LO signal into two LO signals, and using two respective phase shifter circuits for phase shifting each of the two LO signals to generate a respective in-phase LO signal and a respective quadrature LO signal for each pair of I/Q signals (as performed in circuit 300), in embodiments exemplified in FIG. 2, a single phase shifter circuit 362 is used to generate an in-phase LO signal and a quadrature LO signal, which are then each divided/split to provide the appropriate respective in-phase LO signals and respective quadrature LO signals for the respective mixers. For example, the in-phase LO signal provided by circuit 362 may be divided/split by divider circuit 356 to provide in-phase LO signals to mixers 304 and 310 corresponding to the pair of differential in-phase baseband signals. Similarly, the quadrature LO signal provided by circuit 362 at port 21 may be divided/split by divider circuit 364 to provide quadrature LO signals to mixers 308 and 314 corresponding to the pair of differential quadrature baseband signals.

Thus, in some embodiments the LO signal may first be divided/split first into a first LO signal and a second LO signal, and respective pairs of in-phase LO signals and quadrature LO signals may be generated from the first LO signal and the second LO signal, respectively, to provide the appropriate LO signals to the respective mixers. In other embodiments, an in-phase LO signal and a quadrature LO signal may first be generated from the LO signal, and the in-phase LO signal and quadrature LO signal may each be divided/split into respective first and second in-phase LO signals and first and second quadrature LO signals to be provided to the appropriate respective mixers.

Exemplary IQMD Circuit According to One Set of Embodiments

Figure 5:
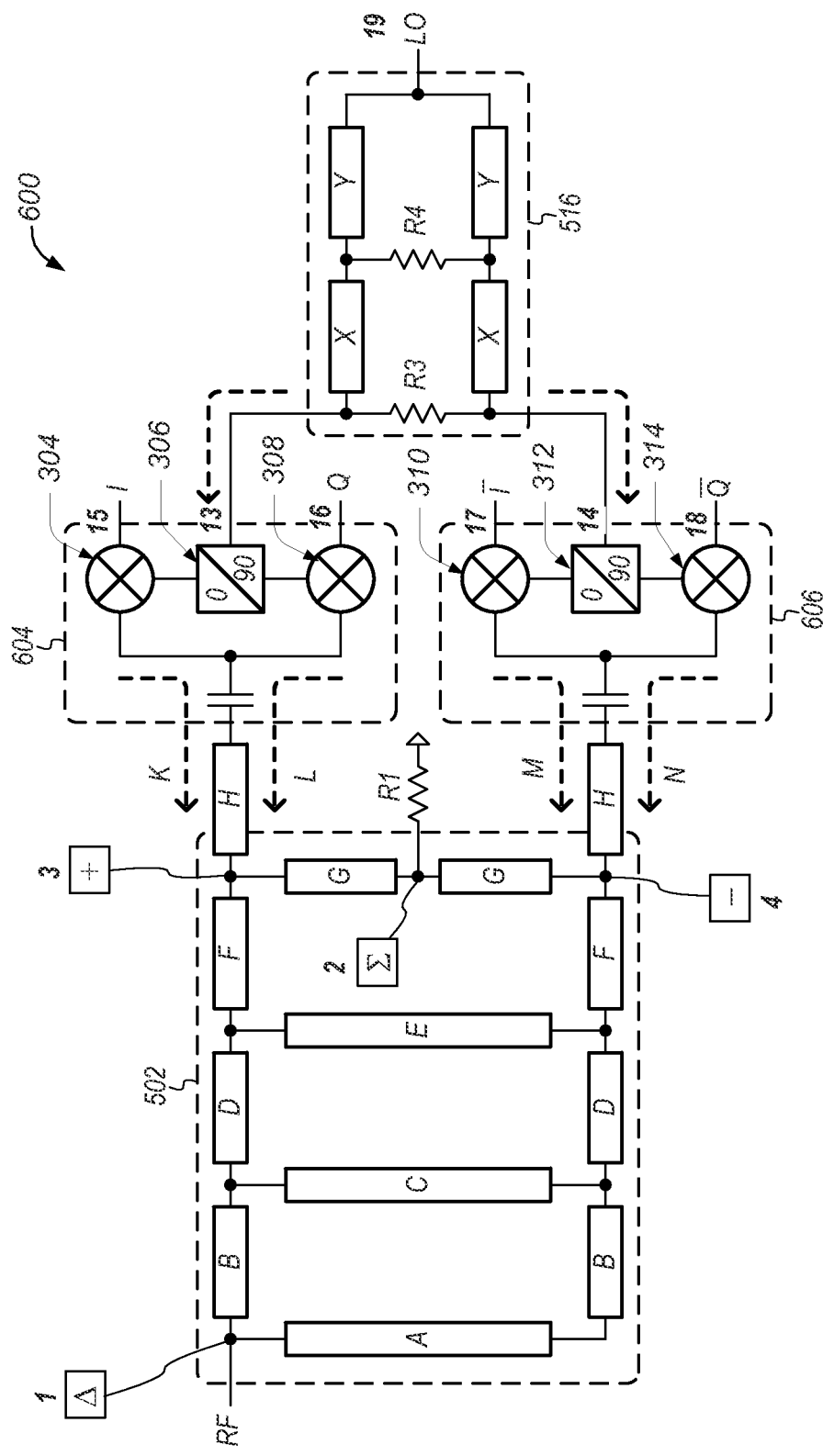
FIG. 5 shows a circuit diagram of an exemplary I/Q modulator/demodulator circuit, according to some embodiments.

FIG. 5 shows the circuit diagram of an exemplary implementation of the proposed I/Q demodulator according to some embodiments. The RF node (1) is shown on the left, the LO (carrier) input (19) is shown on the right, and the pairs of differential in-phase and quadrature baseband signals are shown at ports 15-18, respectively. Again, the port numbers in FIG. 5 correspond to the port numbers in FIG. 1 for each port number that is included in both figures. As previously mentioned, circuit 600 may operate as a modulator by exciting the baseband inputs and making the RF port (1) the output, or it may operate as a demodulator when the RF port (1) is used as an input and the baseband ports (15-18) are used as outputs. The circuit 600 includes four sub-circuits. The first sub-circuit is a 180° hybrid 502, the second sub-circuit is a first I/Q mixer 604 (including phase splitter circuit 306 and mixer circuits 304 and 308), the third cub-circuit is a second I/Q mixer 606 (including phase splitter circuit 312 and mixer circuits 310 and 314), and the fourth sub-circuit is an in-phase power divider 516. In the exemplary circuit shown in FIG. 5, the hybrid 502 is implemented as a microstrip three-section rat-race 180° hybrid circuit. The sum port (2) of the hybrid circuit is terminated with R1, which may be practically formed by the parallel combination of two surface mount thin-film resistors (e.g. two 0201 100Ω surface mount thin-film resistors). The hybrid circuit 502 may be fabricated using microstrips (traces/lines) A-G, with a specified substrate height and dielectric constant (e.g. substrate height of 10 mil and a relative dielectric constant of 3.66). The in-phase power divider 516 may be implemented as two-section Wilkinson combiner. The I/Q mixers may be surface mount GaAs MMIC double-balanced mixers operating over a specified frequency range (e.g. a frequency range of 8.5 GHz to 13.5 GHz. In some embodiments, the hybrid circuit 502 may be shrunk using fractal techniques.

Design Advantages

Various embodiments of the IQMD design disclosed herein provide several advantages in addition to the ability to function as both a modulator and/or a demodulator. High-speed analog baseband circuits are commonly constructed using differential methodologies. Differential circuits offer advantages such as immunity to common-mode noise and spurs, and even-order rejection. Additionally, high-speed ADCs and DACs most often have differential input and output interfaces. Simultaneously, RF and microwave circuits predominantly use single-ended 50Ω interfaces. Embodiments of the disclosed IQMD circuit conveniently accommodate both. In addition to providing a single-ended interface on the RF port, the 180 degree hybrid circuit significantly improves the LO-to-RF isolation of the modulator/demodulator and decreases self-mixing.

Referring again to the exemplary implementation shown in FIG. 5, the LO signal may be applied to both I/Q mixers 604 and 606 with the same phase via the Wilkinson power divider 516. The LO signals may leak from the LO ports to the RF ports of the I/Q mixers, as indicated by dashed arrows K, L, M and N from the I/Q mixers 604 and 606, respectively, towards hybrid circuit 502. The amplitudes of the LO leakage signals (K, L, M, and N) may be reduced by the LO-to-RF isolation of each respective I/Q mixer 604 and 606. The phase and amplitude of signals K and M will be equivalent, as will the phase of signals L and N. Thus, the K and M signals appear in-phase on ports 3 and 4 of the hybrid circuit 502, and may be combined at port 2 and dissipated in R1 instead of appearing at the RF port (1). Similarly, signals L and N may also be dissipated in R1. Therefore, the overall LO-to-RF isolation of IQMD 600 may be significantly improved.

Figure 3:
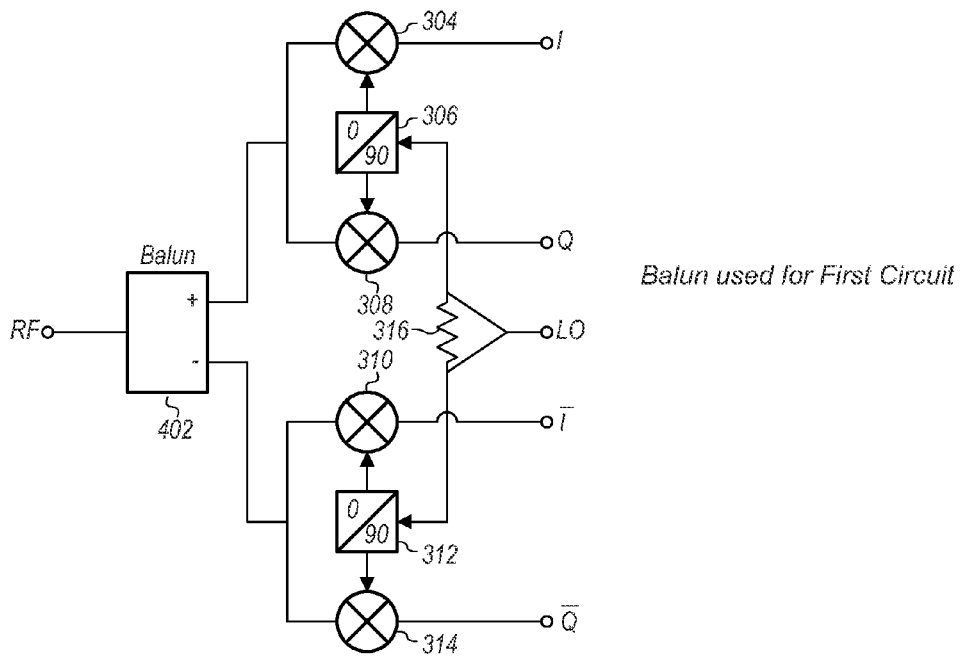
FIG. 3 shows a partial circuit diagram of an exemplary I/Q modulator/demodulator that uses a balun, according to some embodiments.

The LO-RF isolation improvement may also be achieved by replacing the first circuit 302 (or hybrid circuit 502) with a balun, as shown in FIG. 3. Balun 402 is different from hybrid circuit 502, as a balun has an even-mode reflection coefficient of ±1 while a 180 degree hybrid circuit may typically have a reflection coefficient of zero for even-mode excitation. Referring back to FIG. 5, signals K and M, as well as signals L and N may be considered even-mode signals which may be reflected back into the I/Q mixers 604 and 606. It should be noted that the reflected LO signals may re-mix in the I/Q mixers 606 and 606 with the LO signal (a process referred to as self-mixing), and may create voltages at DC and $2f_{LO}$ (i.e. two times the LO frequency) on the baseband ports 15-18.

In some embodiments, IQMD may be designed for a specified tuning range. For example, in some embodiments, the IQMD circuit may have a tuning range of approximately 8.5 to 13.5 GHz. The tuning range may be limited by the bandwidth of the circuit 502, the baluns in the I/Q mixers, and the LO power divider. In order to extend the tuning range, these three components may be extended. For example, in some embodiments, commercially available broadband I/Q mixers with RF/LO ranges exceeding three octaves may be used. In some embodiments, decade bandwidth 180° hybrid circuits may be obtained using asymmetric stepped or tapered backward-wave directional couplers. For example, in order to realize practical coupling profiles, two 8.34 dB couplers may be coupled in tandem. In order to maintain equal even and odd mode phase velocity, homogeneous stripline may be used. The couplers may be implemented in inhomogeneous dielectric (such as microstrip) using wiggly or serpentine techniques for equalizing the even and odd mode phase velocities. In one set of embodiments, the LO power divider 316 may be extended in frequency by using a multi-section stepped or tapered Wilkinson power divider. In other embodiments, a second 180 degree hybrid may be used, and the sum port (3) may be driven with the LO, while the delta port (1) is terminated. In addition, a 3-resistor power divider may also be used, which may benefit from a smaller size but may dissipate more LO power (relative to reactive power division) and may provide less isolation.

Benefits

I/Q modulators and demodulators with wide instantaneous bandwidth are key circuit elements that enable digital radio systems with data rates above 1 Gbps (1 gigabits per second) in the millimeter-wave spectrum. Various embodiments of the IQMD topology disclosed herein features high LO-to-RF isolation, low DC offsets, and convenient interfaces for LO, RF, and baseband circuitry. In various embodiments, the IQMD may be realized using commercial off-the-shelf technology, and may be widely used in numerous applications, exemplified by but not limited to millimeter-wave digital radio systems.

Exemplary Transceiver Incorporating IQMD Circuits

Figure 6:
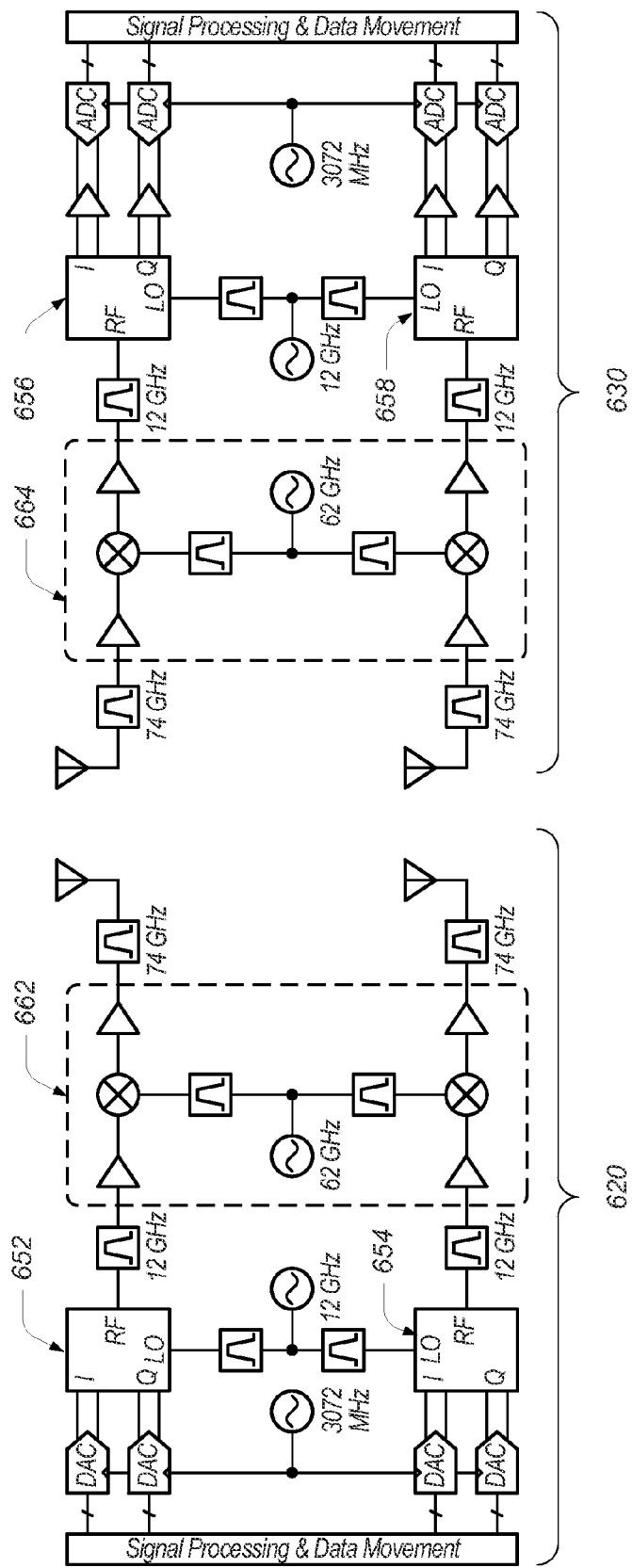
FIG. 6 shows a partial circuit diagram of an exemplary transceiver that uses multiple instances of I/Q modulators/demodulators, according to some embodiments.

FIG. 6 shows a partial circuit diagram of an exemplary transceiver that includes I/Q modulators/demodulators, according to some embodiments. Instances of the IQMD circuit, such as those shown in FIGS. 1, 2, and 5, for example, and may be incorporated into a transceiver system capable of delivering a high encoded data rate at a specified carrier frequency, for example a data rate of 10.2 Gbps at a carrier frequency of 74 GHz. The transceiver circuit in FIG. 6 may include a transmitter sub-circuit 620 and a receiver sub-circuit 630. In transmitter sub-circuit 620, the baseband data may be modulated up to a specified first frequency (e.g. 12 GHz) using I/Q modulators 652 and 654, both of which may be instances of the IQMD detailed, for example, in FIG. 1, and operated as modulators (as previously detailed above). A super-heterodyne stage 662 may be used to upconvert the signal to a specified second frequency (e.g. up to 74 GHz). Similarly, in the receiver sub-circuit 630, the modulated signal may be downconverted from the specified second frequency (e.g. from 74 GHz) to an IF frequency (e.g. 12 GHz) through conversion stage 664, and then converted to baseband using I/Q demodulators 656 and 658, both of which may be instances of the IQMD detailed, for example, in FIG. 1, and operated as demodulators (as previously detailed above).

As shown in FIG. 6, there are bandpass filters coupled to the respective RF and LO ports of the I/Q modulators 652 and 654 and I/Q demodulators 656 and 658. One reason for filtering the LO signal is to eliminate high harmonic levels which have been shown to imbalance I/Q modulators. One reason for filtering the RF signal is to protect the I/Q demodulators (656 and 658) from the higher-order images centered at integer multiples of the carrier frequency, and to prevent the I/Q modulators (652 and 654) from transmitting harmonics of the modulated signal. Another reason for the bandpass filters is to prevent unwanted signals (spurs) and noise at baseband frequencies from entering the respective RF ports of the I/Q demodulators (656 and 658), travelling through the mixer to the IF port, and entering the baseband. This may be especially true if the excess noise ratio at the respective RF inputs of the I/Q demodulators (656 and 658) is high at baseband frequencies (e.g. due to high gain and/or high noise affecting the signals prior to entering the I/Q demodulators), or if the RF-to-IF isolation of the I/Q demodulators is low.

As shown in FIG. 6, the transceiver circuit may use two data streams simultaneously at the same carrier frequency by utilizing both horizontal and vertical antenna polarization and 2×2 MIMO (multiple-input-multiple-output) processing. In some embodiments, the specified encoded data rate (e.g. 10.2 Gbps) may be achieved using a single-carrier 16-QAM (quadrature amplitude modulation) with RRC filtering ($\alpha$=0.3), 7/8 encoding, and a symbol rate of 1536 MBd. The DACs shown in FIG. 6 may implemented as 14-bit DACs while the ADCs shown in FIG. 6 may be implemented as 12-bit ADCs, and they may each be clocked at a sample rate of 3072 MHz (2× oversampling). The DC-offsets and I/Q mismatch may be improved using single-point corrections. It should be noted that the numeric values provided above as well as those provided in FIG. 6 are for illustration purposes only, and various embodiments may use different appropriate values as required for any given implementation.

Although the embodiments above have been described in considerable detail, numerous variations and modifications will become apparent to those skilled in the art once the above disclosure is fully appreciated. It is intended that the following claims be interpreted to embrace all such variations and modifications.

I claim:

1. A modulator/demodulator comprising:
an RF port;
a first circuit comprising a first port coupled to the RF port, and further comprising a second port and a third port, wherein the first circuit is configured to:
  generate a pair of out-of-phase input signals at the second port and third port, responsive to the first port being excited by a first signal received at the RF port; and
  generate a summed output signal at the first port, responsive to the second port and the third port being excited by a pair of out-of-phase output signals;
a first mixer coupled to the second port, and configured to:
  downconvert a first out-of-phase input signal of the pair of out-of-phase input signals to a first pair of incoming baseband signals; and
  upconvert a first pair of outgoing baseband signals to a first out-of-phase output signal of the pair of out-of-phase output signals; and
a second mixer coupled to the third port, and configured to:
  downconvert a second out-of-phase input signal of the pair of out-of-phase input signals to a second pair of incoming baseband signals; and upconvert a second pair of outgoing baseband signals to a second out-of-phase output signal of the pair of out-of-phase output signals.

2. The modulator/demodulator of claim 1, further comprising a local oscillator (LO) port configured to receive an LO signal;
wherein the first mixer and the second mixer are configured to perform upconversion and downconversion based on the LO signal.

3. The modulator/demodulator of claim 2, further comprising:
a zero-phase power splitter coupled to the LO port and configured to receive the LO signal and derive a first LO signal and a second LO signal from the LO signal, wherein the first LO signal and the second LO signal are in phase with respect to each other;
wherein the first mixer is configured to perform upconversion and downconversion based on the first LO signal; and
wherein the second mixer is configured to perform upconversion and downconversion based on the second LO signal.

4. The modulator/demodulator of claim 2, further comprising:
a phase shifter coupled to the LO port and configured to receive the LO signal an generate an in-phase LO signal and a quadrature LO signal based on the LO signal;
wherein the first mixer and the second mixer are each configured to perform upconversion and downconversion based on the in-phase LO signal and the quadrature LO signal.

5. The modulator/demodulator of claim 4, further comprising:
a first zero-phase power splitter configured to receive the in-phase LO signal and derive a first in-phase LO signal and a second in-phase LO signal from the in-phase LO signal; and
a second zero-phase power splitter configured to receive the quadrature LO signal and derive a first quadrature LO signal and a second quadrature LO signal from the quadrature LO signal;
wherein the first mixer is configured to perform upconversion and downconversion using the first in-phase LO signal and the first quadrature LO signal; and
wherein the second mixer is configured to perform upconversion and downconversion using the second in-phase LO signal and the second quadrature LO signal.

6. The modulator/demodulator of claim 1, wherein the first circuit is one of:
a hybrid circuit further comprising a fourth port, and further configured to generate a second summed output signal at the first port, responsive to the second port and the third port being excited by a pair of in-phase output signals; or
a balun circuit, wherein the first port of the first circuit is an unbalanced port of the balun circuit, and the second and third ports of the first circuit are balanced ports of the balun circuit.

7. The modulator/demodulator of claim 1, wherein the first pair of incoming baseband signals comprises a first incoming in-phase baseband signal and a first incoming quadrature baseband signal, and wherein the first pair of outgoing baseband signals comprises a first outgoing in-phase baseband signal and a first outgoing quadrature baseband signal;

wherein the second pair of incoming baseband signals comprises a second incoming in-phase baseband signal and a second incoming quadrature baseband signal, and wherein the second pair of outgoing baseband signals comprises a second outgoing in-phase baseband signal and a second outgoing quadrature baseband signal;
wherein the first incoming in-phase baseband signal and the second incoming in-phase baseband signal form an incoming pair of differential in-phase baseband signals;
wherein the first incoming quadrature baseband signal and the second incoming quadrature baseband signal form an incoming pair of differential quadrature baseband signals;
wherein the first outgoing in-phase baseband signal and the second outgoing in-phase baseband signal form an outgoing pair of differential in-phase baseband signals; and
wherein the first outgoing quadrature baseband signal and the second outgoing quadrature baseband signal form an outgoing pair of differential quadrature baseband signals.

8. The modulator/demodulator of claim 1, wherein each mixer of the first mixer and the second mixer comprises:
a first mixer circuit configured to:
receive an in-phase baseband signal when upconverting; and
provide an in-phase baseband signal when downconverting; and
a second mixer circuit configured to:
receive a quadrature baseband signal when upconverting; and
provide a quadrature baseband signal when downconverting.

9. The modulator/demodulator of claim 8, wherein the first mixer circuit and the second mixer circuit are each double-balanced passive mixer circuits.

10. The modulator/demodulator of claim 8, wherein each mixer of the first mixer and the second mixer further comprises:
a phase shifter circuit configured to:
generate an in-phase oscillator signal and a quadrature oscillator signal based on a received local oscillator signal;
provide the in-phase oscillator signal to the first mixer circuit, wherein the first mixer circuit is configured to perform modulation and demodulation using the in-phase oscillator signal; and
provide the quadrature oscillator signal to the second mixer circuit; wherein the second mixer circuit is configured to perform modulation and demodulation using the in-phase oscillator signal.

11. A transceiver comprising:
a first modulator/demodulator circuit; and
a second modulator/demodulator circuit;
wherein each modulator/demodulator circuit of the first modulator/demodulator circuit and the second modulator/demodulator circuit comprises:
an RF port;
a first circuit comprising a first port coupled to the RF port, and further comprising a second port and a third port, wherein the first circuit is configured to:
generate a pair of out-of-phase input signals at the second port and third port, responsive to the first port being excited by a first signal received at the RF port; and generate a summed output signal at the first port, responsive to the second port and the third port being excited by a pair of out-of-phase output signals;

a first mixer coupled to the second port, and configured to:
- downconvert a first out-of-phase input signal of the pair of out-of-phase input signals to a first pair of incoming baseband signals; and
- upconvert a first pair of outgoing baseband signals to a first out-of-phase output signal of the pair of out-of-phase output signals; and a second mixer coupled to the third port, and configured to:
- downconvert a second out-of-phase input signal of the pair of out-of-phase input signals to a second pair of incoming baseband signals; and
- upconvert a second pair of outgoing baseband signals to a second out-of-phase output signal of the pair of out-of-phase output signals.

12. The transceiver of claim 11 wherein the first modulator/demodulator circuit is configured to perform modulation and the second modulator/demodulator circuit is configured to perform demodulation.

13. The transceiver of claim 12, wherein each modulator/demodulator circuit further comprises a respective local oscillator (LO) port configured to receive a respective LO signal;
- wherein the first mixer and the second mixer of the first modulator/demodulator circuit are configured to perform upconversion based on the respective LO signal received by the first modulator/demodulator circuit; and
- wherein the first mixer and the second mixer of the second modulator/demodulator circuit are configured to perform downconversion based on the respective LO signal received by the second modulator/demodulator circuit.

14. The transceiver of claim 13, wherein each modulator/demodulator circuit further comprises:
- a respective zero-phase power splitter coupled to the respective LO port and configured to receive the respective LO signal and derive a respective first LO signal and a respective second LO signal from the respective LO signal, wherein the respective first LO signal and the respective second LO signal are in phase with respect to each other;
- wherein the first mixer of the first modulator/demodulator circuit is configured to perform upconversion based on the respective first LO signal derived from the respective LO signal received by the first modulator/demodulator circuit;
- wherein the second mixer of first modulator/demodulator circuit is configured to perform upconversion based on the respective second LO signal derived from the respective LO signal received by the first modulator/demodulator circuit;
- wherein the first mixer of the second modulator/demodulator circuit is configured to perform downconversion based on the respective first LO signal derived from the respective LO signal received by the second modulator/demodulator circuit; and
- wherein the second mixer of the second modulator/demodulator circuit is configured to perform downconversion based on the respective second LO signal derived from the respective LO signal received by the second modulator/demodulator circuit.

15. The transceiver of claim 13, wherein each modulator/demodulator circuit further comprises a respective phase shifter coupled to the respective LO port and configured to receive the respective LO signal and generate a respective in-phase LO signal and a respective quadrature LO signal based on the respective LO signal;
- wherein the first mixer and the second mixer of the first modulator/demodulator circuit are each configured to perform upconversion based on the respective in-phase LO signal and the respective quadrature LO signal generated from the respective LO signal received by the first modulator/demodulator circuit; and
- wherein the first mixer and the second mixer of the second modulator/demodulator circuit are each configured to perform downconversion based on the respective in-phase LO signal and the respective quadrature LO signal generated from the respective LO signal received by the second modulator/demodulator circuit.

16. The transceiver of claim 12, further comprising:
- a plurality of digital-to-analog converters coupled to the first modulator/demodulator circuit and configured to provide unmodulated analog baseband signals to the first modulator/demodulator circuit; and
- a plurality of analog-to-digital converters coupled to the second modulator/demodulator circuit and configured to receive demodulated analog baseband signals from the second modulator/demodulator circuit.

17. The transceiver of claim 11, wherein the first circuit is one of:
- a hybrid circuit further comprising a fourth port, and further configured to generate a second summed output signal at the first port, responsive to the second port and the third port being excited by a pair of in-phase output signals; or
- a balun circuit, wherein the first port of the first circuit is an unbalanced port of the balun circuit, and the second and third ports of the first circuit are balanced ports of the balun circuit.

18. The transceiver of claim 11, wherein the first pair of incoming baseband signals comprises a first incoming in-phase baseband signal and a first incoming quadrature baseband signal, and wherein the first pair of outgoing baseband signals comprises a first outgoing in-phase baseband signal and a first outgoing quadrature baseband signal;
- wherein the second pair of incoming baseband signals comprises a second incoming in-phase baseband signal and a second incoming quadrature baseband signal, and wherein the second pair of outgoing baseband signals comprises a second outgoing in-phase baseband signal and a second outgoing quadrature baseband signal;
- wherein the first incoming in-phase baseband signal and the second incoming in-phase baseband signal form an incoming pair of differential in-phase baseband signals;
- wherein the first incoming quadrature baseband signal and the second incoming quadrature baseband signal form an incoming pair of differential quadrature baseband signals;
- wherein the first outgoing in-phase baseband signal and the second outgoing in-phase baseband signal form an outgoing pair of differential in-phase baseband signals; and
- wherein the first outgoing quadrature baseband signal and the second outgoing quadrature baseband signal form an outgoing pair of differential quadrature baseband signals.

19. The transceiver of claim 11, wherein each mixer of the first mixer and the second mixer comprises:

a first mixer circuit configured to:
  receive an in-phase baseband signal when upconverting; and
  provide an in-phase baseband signal when downconverting; and
a second mixer circuit configured to:
  receive a quadrature baseband signal when upconverting; and
  provide quadrature baseband signal when downconverting.

20. The transceiver of claim 11, further comprising:
a first plurality of modulator/demodulator circuits; and
a second plurality of modulator/demodulator circuits;
wherein the first modulator/demodulator circuit and the first plurality of modulator/demodulator circuits are configured to perform modulation for multiple-input-multiple-out wireless signal transmissions; and
wherein the second modulator/demodulator circuit and the second plurality of modulator/demodulator circuits are configured to perform demodulation for the multiple-input-multiple-out wireless signal transmissions.

* * * * *